(12) United States Patent
Choi et al.

(10) Patent No.: US 11,949,047 B2
(45) Date of Patent: *Apr. 2, 2024

(54) DISPLAY DEVICE USING SEMICONDUCTOR LIGHT EMITTING ELEMENT

(71) Applicant: LG ELECTRONICS INC., Seoul (KR)

(72) Inventors: Hwanjoon Choi, Seoul (KR); Yonghan Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/738,712

(22) Filed: May 6, 2022

(65) Prior Publication Data

US 2022/0262987 A1   Aug. 18, 2022

Related U.S. Application Data

(63) Continuation of application No. 16/465,051, filed as application No. PCT/KR2017/001025 on Jan. 31, 2017, now Pat. No. 11,355,673.

(30) Foreign Application Priority Data

Dec. 7, 2016   (KR) .................. 10-2016-0166011

(51) Int. Cl.
  *H01L 33/44*   (2010.01)
  *G09F 9/30*   (2006.01)
  (Continued)

(52) U.S. Cl.
  CPC ............ *H01L 33/44* (2013.01); *G09F 9/30* (2013.01); *H01L 27/15* (2013.01); *H01L 27/156* (2013.01);
  (Continued)

(58) Field of Classification Search
  CPC ....... H01L 33/44; H01L 27/15; H01L 27/156; H01L 33/36; H01L 33/38; H01L 25/0753;
  (Continued)

(56) References Cited

U.S. PATENT DOCUMENTS 11,355,673 B2 *   6/2022   Choi ...................... G09F 9/30
2011/0220931 A1   9/2011   Kojima
(Continued)

FOREIGN PATENT DOCUMENTS

CN   102270727 A   12/2011
CN   102881811 A   1/2013
(Continued)

*Primary Examiner* — Su C Kim
(74) *Attorney, Agent, or Firm* — Birch, Stewart Kolasch & Birch, LLP

(57) ABSTRACT

Discussed is a display device having a plurality of semiconductor light emitting elements mounted on a substrate, wherein at least one of the semiconductor light emitting elements includes a first electrode and a second electrode spaced apart each other, a first conductivity type semiconductor layer disposed with the first electrode, a second conductivity type semiconductor layer configured to overlap with the first conductivity type semiconductor layer, and disposed with the second electrode, a first passivation layer covering outer surfaces of the first conductivity type semiconductor layer and the second conductivity type semiconductor layer, and a second passivation layer covering the first passivation layer, wherein at least one portion of the second electrode is overlapped with at least one portion of the first electrode along the thickness direction of the semiconductor light emitting element.

20 Claims, 13 Drawing Sheets

(51) Int. Cl.
 *H01L 27/15* (2006.01)
 *H01L 33/36* (2010.01)
 *H01L 33/38* (2010.01)
 *H05B 33/10* (2006.01)
 *H05B 33/12* (2006.01)

(52) U.S. Cl.
 CPC .............. *H01L 33/36* (2013.01); *H01L 33/38* (2013.01); *H05B 33/10* (2013.01); *H05B 33/12* (2013.01)

(58) Field of Classification Search
 CPC ....... H01L 33/486; H01L 33/46; H01L 33/62; H01L 33/52; H01L 2924/12041; G09F 9/30; G09F 9/301; H05B 33/10; H05B 33/12
 See application file for complete search history.

(56) References Cited

U.S. PATENT DOCUMENTS

| | | | |
|---|---|---|---|
| 2011/0284822 A1 | 11/2011 | Jung et al. | |
| 2012/0241793 A1 | 9/2012 | In et al. | |
| 2013/0248910 A1 | 9/2013 | Kimura et al. | |
| 2014/0252388 A1 | 9/2014 | Kimura et al. | |
| 2014/0353708 A1* | 12/2014 | Seo ................... | H01L 33/405 257/98 |
| 2016/0043282 A1 | 2/2016 | Chae et al. | |
| 2016/0141467 A1 | 5/2016 | Li et al. | |
| 2017/0179097 A1 | 8/2017 | Zhang et al. | |
| 2018/0175247 A1* | 6/2018 | Yoon ................... | H01L 33/62 |

FOREIGN PATENT DOCUMENTS

| | | |
|---|---|---|
| CN | 103003966 A | 3/2013 |
| CN | 103325933 A | 9/2013 |
| CN | 104037299 A | 9/2014 |
| CN | 106067462 A | 11/2016 |
| EP | 2197051 A2 | 6/2010 |
| EP | 2393135 A1 | 12/2011 |
| EP | 2546894 A2 | 1/2013 |
| EP | 2642535 A2 | 9/2013 |
| JP | 2007-142368 A | 6/2007 |
| KR | 10-2013-0008478 A | 1/2013 |
| KR | 10-2015-0021233 A | 3/2015 |
| KR | 10-1529934 B1 | 6/2015 |
| KR | 10-2016-0126779 A | 11/2016 |

* cited by examiner

DISPLAY DEVICE USING SEMICONDUCTOR LIGHT EMITTING ELEMENT

CROSS-REFERENCE TO RELATED APPLICATIONS

This Application is a Continuation of U.S. patent application Ser. No. 16/465,051, filed on May 29, 2019 (now U.S. Pat. No. 11,355,673, issued on Jun. 7, 2022), which was filed as the National Phase of PCT International Application No. PCT/KR2017/001025, filed on Jan. 31, 2017, which claims priority under 35 U.S.C. 119(a) to Patent Application No. 10-2016-0166011, filed in Republic of Korea on Dec. 7, 2016, the entire contents of all these applications are hereby expressly incorporated by reference into the present application.

BACKGROUND OF THE DISCLOSURE

Field of the Invention

The present disclosure relates to a display device and a manufacturing method thereof, and more particularly, to a display device using a semiconductor light emitting element.

Discussion of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting elements may be used to implement a flexible display, thereby presenting a scheme for solving the problems.

However, due to the shape of the semiconductor light emitting element, the size and ratio of the p-electrode and n-electrode are limited, which may cause restriction on the improvement of the image quality. Furthermore, the semiconductor light emitting element has a drawback in that it is weak against an external impact due to a low thickness compared to its area. Therefore, in a flexible display using the semiconductor light emitting element, there may exist a need to enhance the image quality and durability of the semiconductor light emitting element by overcoming the restriction and drawback. Accordingly, the present disclosure proposes a new mechanism capable of enhancing the luminous efficiency and durability of the semiconductor light emitting element.

SUMMARY OF THE DISCLOSURE

An object of the present disclosure is to provide a display device having a semiconductor light emitting element capable of allowing an area variation of electrodes and increasing the luminous efficiency.

Another object of the present disclosure is to provide a structure for enhancing durability in a display device.

A display device according to the present disclosure may increase the luminous efficiency and durability of the display device by using a double passivation layer.

For a specific example, the display device may include a plurality of semiconductor light emitting elements mounted on a substrate, wherein at least one of the semiconductor light emitting elements includes a first conductive electrode and a second conductive electrode, a first conductive semiconductor layer disposed with the first conductive electrode, a second conductive semiconductor layer configured to overlap with the first conductive semiconductor layer, and disposed with the second conductive electrode, a first passivation layer formed to cover outer surfaces of the first conductive semiconductor layer and the second conductive semiconductor layer, and a second passivation layer formed to cover the first passivation layer, and formed to vary in thickness in at least part thereof.

According to an embodiment, the first passivation layer may include a first portion covering a lower surface of the first conductive semiconductor layer and a second portion covering a lower surface of the second conductive semiconductor layer, and the first portion and the second portion may have a height difference with respect to the second conductive semiconductor layer.

An outer surface of a portion covering the first portion and the second portion on the second passivation layer may be a lower surface of the second passivation layer, and the lower surface of the second passivation layer may be formed as a plane with no height difference due to a thickness variation of the second passivation layer.

Through-holes may be formed in the first passivation layer and the second passivation layer, and the first conductive electrode and the second conductive electrode may be respectively extended to a plane with no height difference on the second passivation layer through the through-holes.

According to an embodiment, a lower surface of the second passivation layer may have an area different from that of the first passivation layer. An area of the lower surface of the second passivation layer may be larger than that of the lower surface of the first passivation layer.

According to an embodiment, the first passivation layer and the second passivation layer may be formed with different patterns or shapes. The second passivation layer may be configured to have a cross-sectional shape different from that of the first passivation layer due to the thickness variation. The first passivation layer may be formed with a uniform thickness, and the second passivation layer may be formed with a non-uniform thickness.

According to an embodiment, the second passivation layer may include a portion that does not overlap with the second conductive semiconductor layer along a thickness direction of the semiconductor light emitting element, and at least one of the first conductive electrode and the second conductive electrode may be formed to cover the non-overlapping portion. At least part of the second conductive electrode may overlap with the first conductive semiconductor layer along a thickness direction of the semiconductor light emitting element. A ratio of projected areas of the first conductive electrode and the second conductive electrode may be formed closer to 1:1 than that of projected areas of the first conductive semiconductor layer and the second conductive semiconductor layer.

According to an embodiment, the first passivation layer may be formed of a silicon compound or oxide, and the second passivation layer may be made of a polymer.

In addition, the present disclosure discloses a semiconductor light emitting element, including a first conductive electrode and a second conductive electrode, a first conductive semiconductor layer disposed with the first conductive electrode, a second conductive semiconductor layer configured to overlap with the first conductive semiconductor layer and disposed with the second conductive electrode, a first passivation layer formed to cover outer surfaces of the first conductive semiconductor layer and the second conductive semiconductor layer, and a second passivation layer formed to cover the first passivation layer, and formed to vary in thickness in at least part thereof.

In a display device according to the present disclosure, it may be possible to prevent damage due to a physical impact on an inner passivation layer having a uniform thickness through an outer passivation layer formed with a non-uniform thickness. Furthermore, the thickness of the semiconductor light emitting element may be increased compared to the area, thereby alleviating a physical impact applied from the outside.

In addition, the outer passivation layer may form a larger area of the plane using a change of the thickness, thereby increasing a degree of design freedom for an area variation of the n-electrode and p-electrode. Therefore, a ratio of the n-electrode to the p-electrode may be implemented close to one-to-one, and thus the supply path of current may be made more uniform, thereby increasing the image quality of the display.

Besides, according to the present disclosure, the area of the n-electrode and p-electrode may be further increased, and thus the rear reflective surface by the electrode may be widened, thereby increasing the luminous efficiency.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
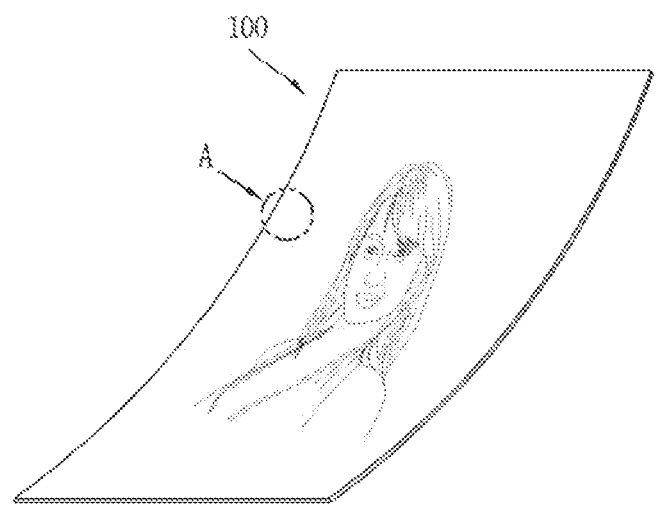
FIG. 1 is a conceptual view illustrating a display device using a semiconductor light emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting element according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display manufactured on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light emitting element. According to the present disclosure, a light emitting diode (LED) is illustrated as a type of semiconductor light emitting element. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
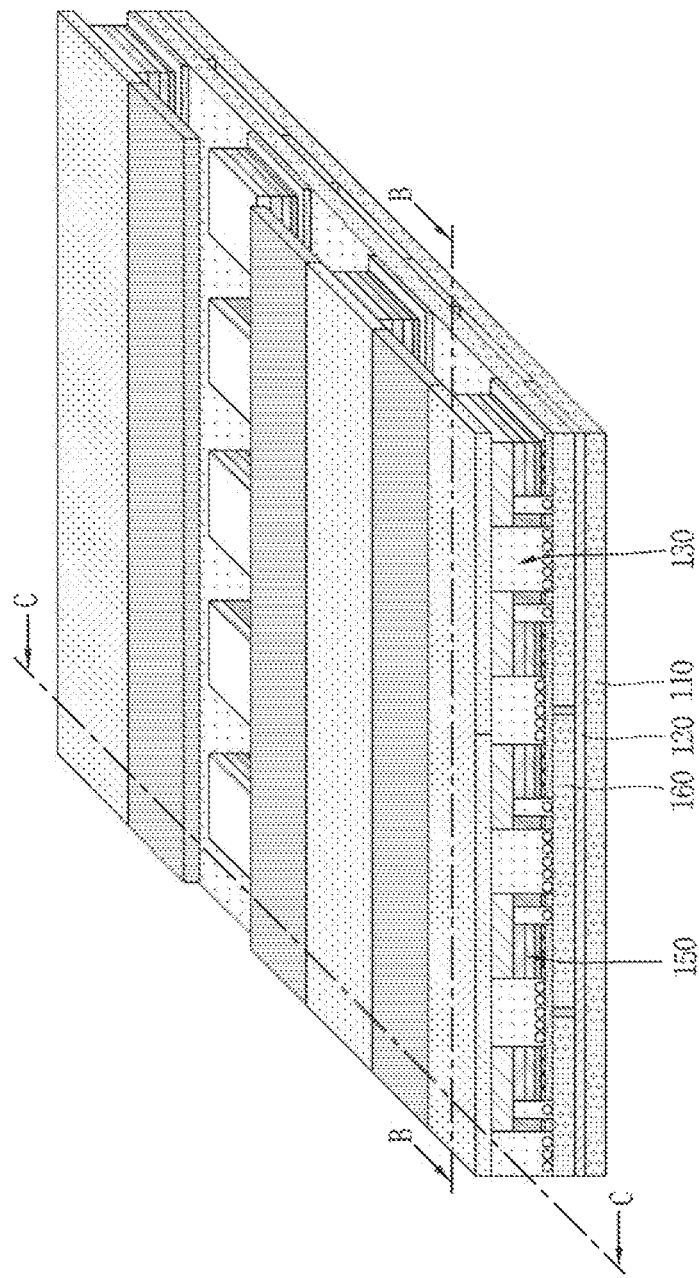
FIG. 2 is a partial enlarged view of portion "A" in FIG. 1, and FIGS. 3A and 3B are cross-sectional views taken along lines B-B and C-C in FIG. 2.
Figure 3A:
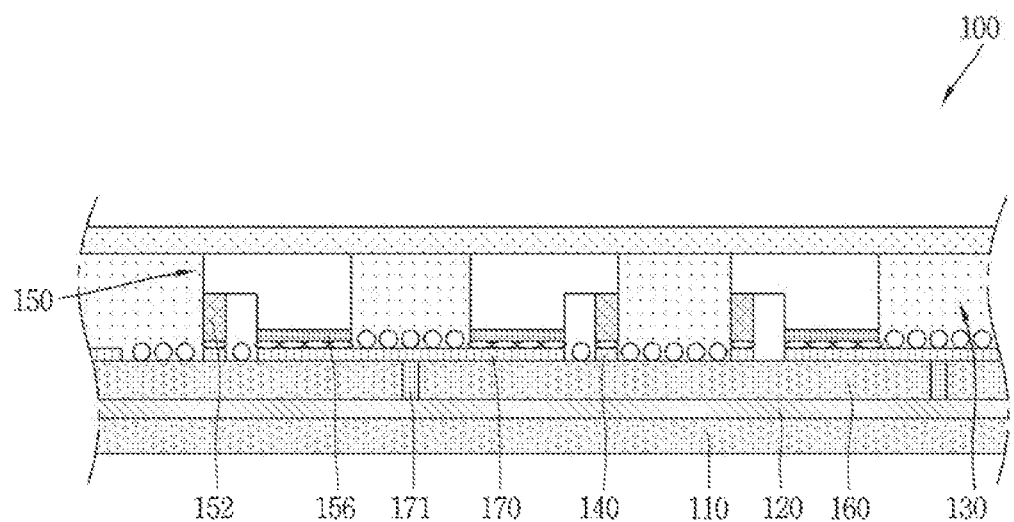
Figure 3B:
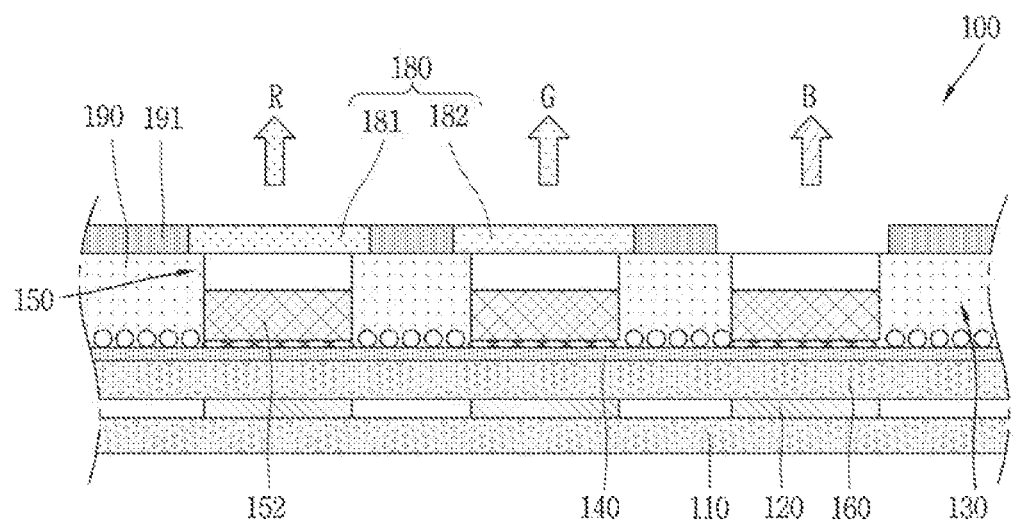
Figure 4:
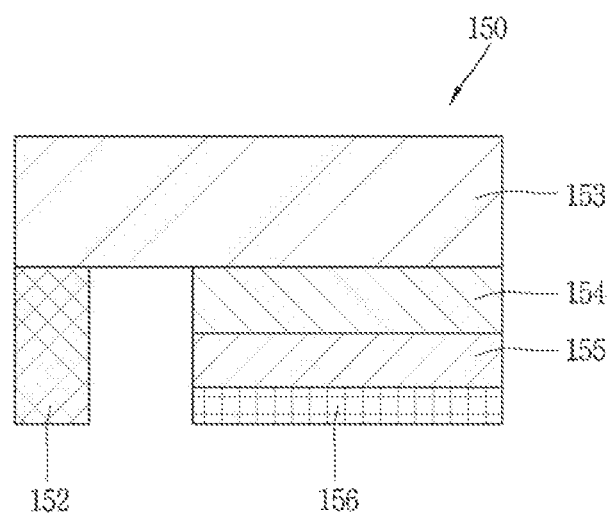
FIG. 4 is a conceptual view showing a flip chip type semiconductor light emitting element in FIGS. 3A and 3B.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting element in FIG. 3A, and FIGS. 5A through 5C are conceptual views illustrating various forms for implementing colors in connection with a flip-chip type semiconductor light emitting element.

According to the drawings in FIGS. 2, 3A and 3B, there is illustrated a display device 100 using a passive matrix (PM) type semiconductor light emitting element as a display device 100 using a semiconductor light emitting element. However, an example described below may also be applicable to an active matrix (AM) type semiconductor light emitting element.

The display device 100 may include a substrate 110, a first electrode 120, a conductive adhesive layer 130, a second electrode 140, and a plurality of semiconductor light emitting elements 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting element 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film.

For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting element 150 is connect thereto in a flip chip form with the application of heat and pressure, the semiconductor light emitting element 150 is electrically connected to the first electrode 120 and second electrode 140.

Referring to FIG. 4, the semiconductor light emitting element may be a flip chip type semiconductor light emitting element.

For example, the semiconductor light emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting elements 150. For example, the left and right p-type electrodes of the semiconductor light emitting elements around the auxiliary electrode may be electrically connected to one auxiliary electrode.

More specifically, the semiconductor light emitting element 150 is pressed into the conductive adhesive layer 130, and through this, only a portion between the p-type electrode 156 and auxiliary electrode 170 of the semiconductor light emitting element 150 and a portion between the n-type electrode 152 and second electrode 140 of the semiconductor light emitting element 150 have conductivity, and the remaining portion does not have conductivity since there is no push-down of the semiconductor light emitting element. As described above, the conductive adhesive layer 130 may form an electrical connection as well as allow a mutual coupling between the semiconductor light emitting element 150 and the auxiliary electrode 170 and between the semiconductor light emitting element 150 and the second electrode 140.

Furthermore, a plurality of semiconductor light emitting elements 150 constitute a light-emitting array, and a phosphor layer 180 is formed on the light-emitting array.

The light emitting device array may include a plurality of semiconductor light emitting elements with different self-luminance values. Each of the semiconductor light emitting elements 150 constitutes a sub-pixel, and is electrically connected to the first electrode 120. For example, there may exist a plurality of first electrodes 120, and the semiconductor light emitting elements are arranged in several rows, for instance, and each row of the semiconductor light emitting elements may be electrically connected to any one of the plurality of first electrodes.

Furthermore, the semiconductor light emitting elements may be connected in a flip chip form, and thus semiconductor light emitting elements grown on a transparent dielectric substrate. Furthermore, the semiconductor light emitting elements may be nitride semiconductor light emitting elements, for instance. The semiconductor light emitting element 150 has an excellent luminance characteristic, and thus it may be possible to configure individual sub-pixels even with a small size thereof.

According to the drawing, a partition wall 190 may be formed between the semiconductor light emitting elements 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting element 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting element 150. For example, the semiconductor light emitting element 150 is a blue semiconductor light emitting element that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting element at a location implementing a red sub-pixel, and a green phosphor 182 capable of converting blue light into green (G) light may be deposited on the blue semiconductor light emitting element at a location implementing a green sub-pixel. Furthermore, only the blue semiconductor light emitting element may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light emitting element 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
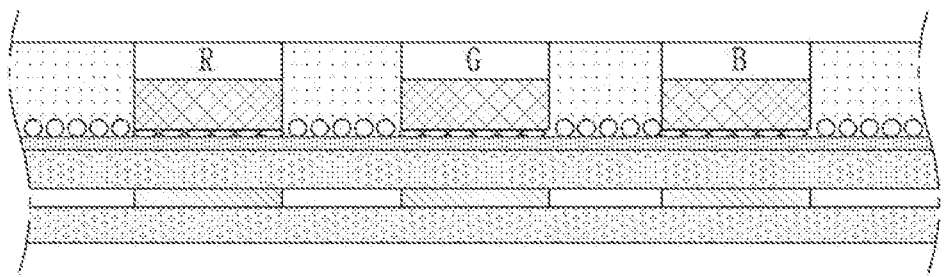
FIGS. 5A through 5C are conceptual views illustrating various forms for implementing colors in connection with a flip-chip type semiconductor light emitting element.

Referring to FIG. 5A, each of the semiconductor light emitting elements 150 may be implemented with a high-power light emitting device that emits various lights including blue in which gallium nitride (GaN) is mostly used, and indium (In) and or aluminum (Al) are added thereto.

In this case, the semiconductor light emitting element 150 may be red, green and blue semiconductor light emitting elements, respectively, to implement each sub-pixel. For instance, red, green and blue semiconductor light emitting elements (R, G, B) are alternately disposed, and red, green and blue sub-pixels implement one pixel by means of the red, green and blue semiconductor light emitting elements, thereby implementing a full color display.

Figure 5B:
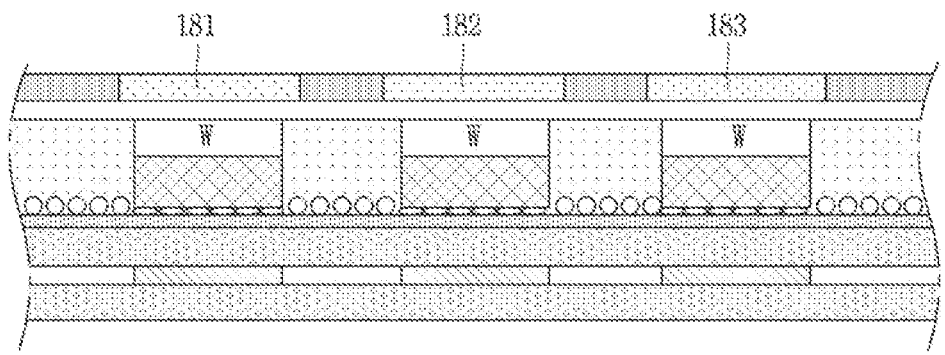

Referring to FIG. 5B, the semiconductor light emitting element may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
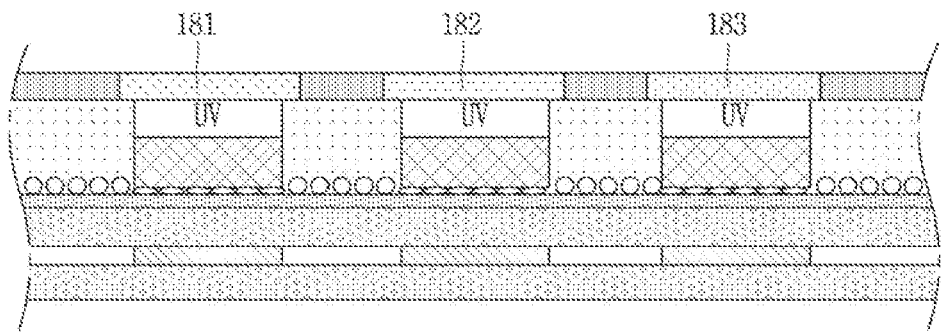

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting element can be used over the entire region up to ultra violet (UV) as well as visible light, and may be extended to a form of semiconductor light emitting element in which ultra violet (UV) can be used as an excitation source.

Taking the present example into consideration again, the semiconductor light emitting element 150 is placed on the conductive adhesive layer 130 to configure a sub-pixel in the display device. The semiconductor light emitting element 150 may have excellent luminance characteristics, and thus it may be possible to configure individual sub-pixels even with a small size thereof. The size of the individual semiconductor light emitting element 150 may be less than 80 μm in the length of one side thereof, and formed with a rectangular or square shaped element. In case of a rectangular shaped element, the size thereof may be less than 20×80 μm.

Furthermore, even when a square shaped semiconductor light emitting element 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light emitting elements becomes sufficiently large. Accordingly, in this case, it may be possible to implement a flexible display device having a HD image quality.

A display device using the foregoing semiconductor light emitting element will be manufactured by a new type of manufacturing method. Hereinafter, the manufacturing method will be described with reference to FIG. 6.

Figure 6:
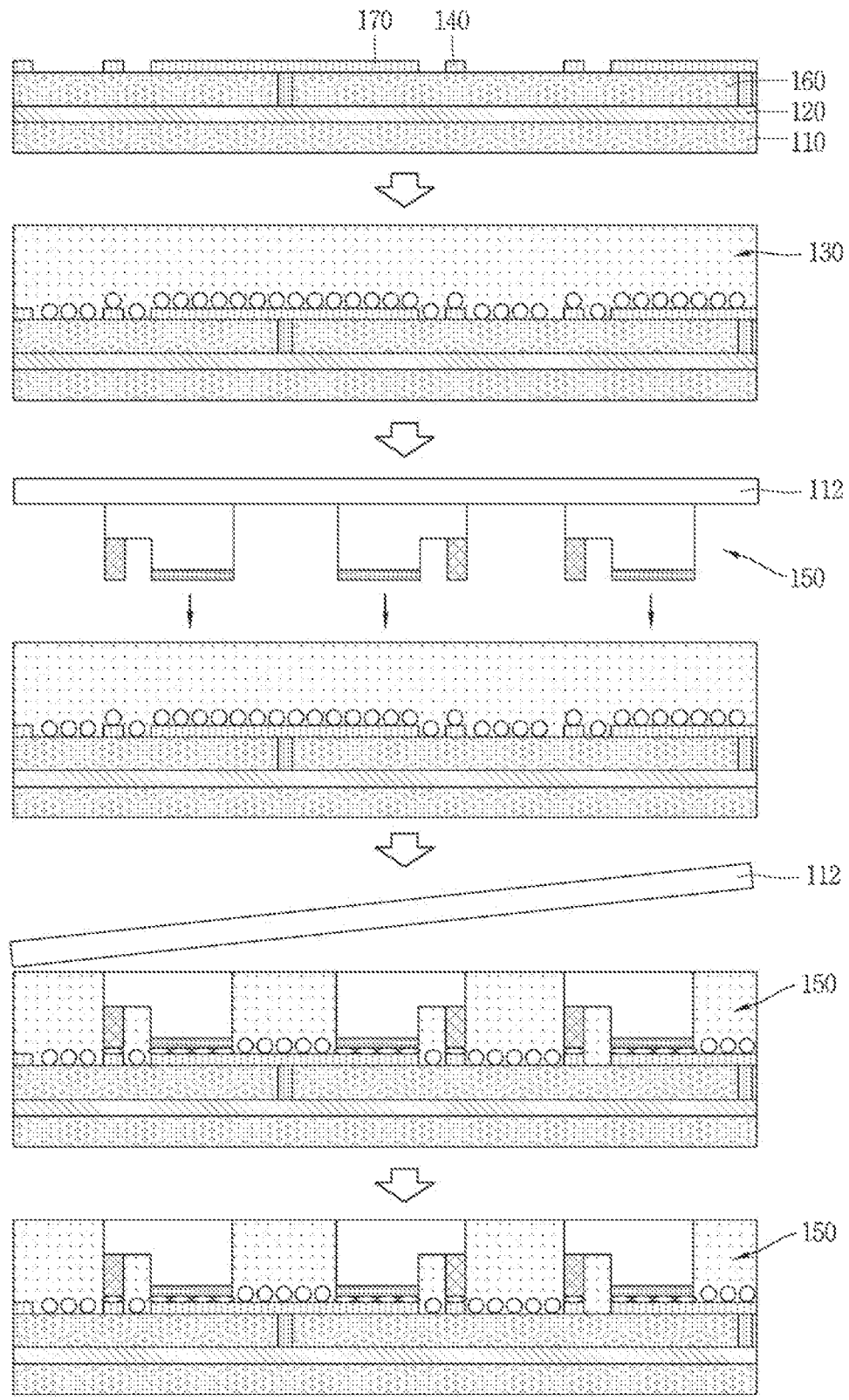
FIG. 6 is cross-sectional views illustrating a manufacturing method of a display device using a semiconductor light emitting element according to the present disclosure.

FIG. 6 is cross-sectional views illustrating a manufacturing method of a display device using a semiconductor light emitting element according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting elements 150 corresponding to the location of the auxiliary electrodes 170 and second electrodes 140 and constituting individual pixels is disposed such that the semiconductor light emitting element 150 faces the auxiliary electrode 170 and second electrode 140.

In this case, the second substrate 112 as a growth substrate for growing the semiconductor light emitting element 150 may be a sapphire substrate or silicon substrate.

The semiconductor light emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting element 150 and the auxiliary electrode 170 and second electrode 140 may have conductivity due to the characteristics of an anisotropic conductive film having conductivity by thermal compression, thereby allowing the electrodes and semiconductor light emitting element 150 to be electrically connected to each other. At this time, the semiconductor light emitting element 150 may be inserted into the anisotropic conductive film, thereby forming a partition wall between the semiconductor light emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting elements 150 to the outside. Silicon oxide (SiOx) or the like may be coated on the wiring substrate coupled to the semiconductor light emitting element 150 to form a transparent insulating layer (not shown).

Furthermore, it may further include the process of forming a phosphor layer on one surface of the semiconductor light emitting element 150. For example, the semiconductor light emitting element 150 may be a blue semiconductor light emitting element for emitting blue (B) light, and red or green phosphor for converting the blue (B) light into the color of the sub-pixel may form a layer on one surface of the blue semiconductor light emitting element.

The manufacturing method or structure of a display device using the foregoing semiconductor light emitting element may be modified in various forms. For such an example, the foregoing display device may be applicable to a vertical semiconductor light emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
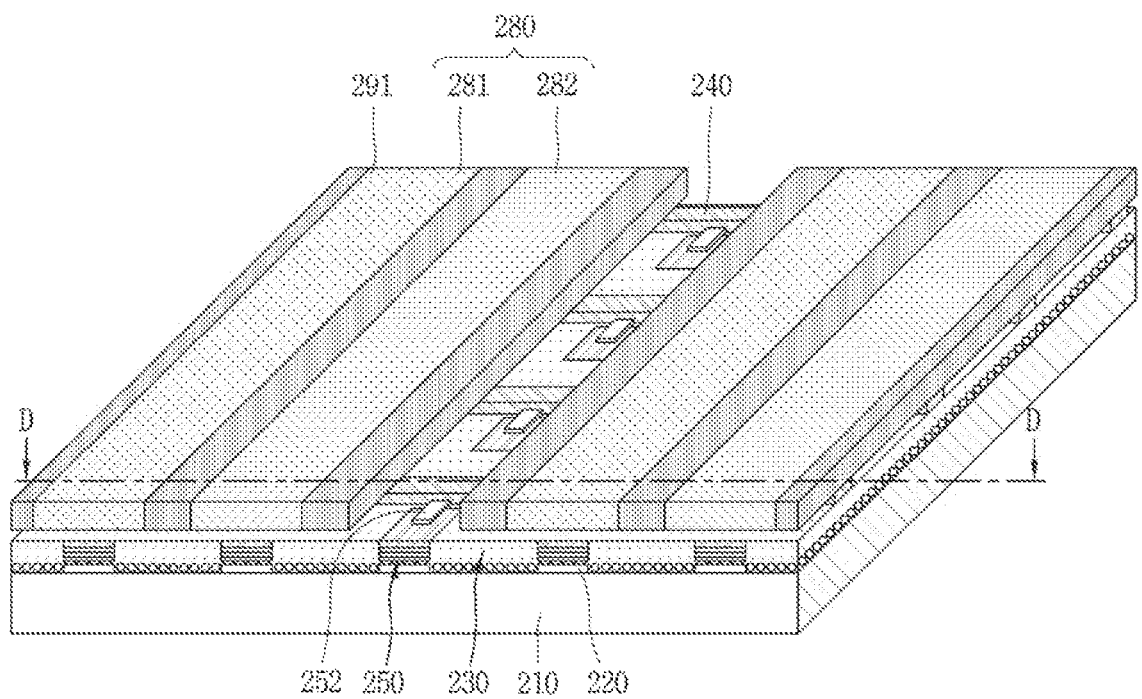
FIG. 7 is a perspective view illustrating a display device using a semiconductor light emitting element according to another embodiment of the present disclosure.
Figure 8:
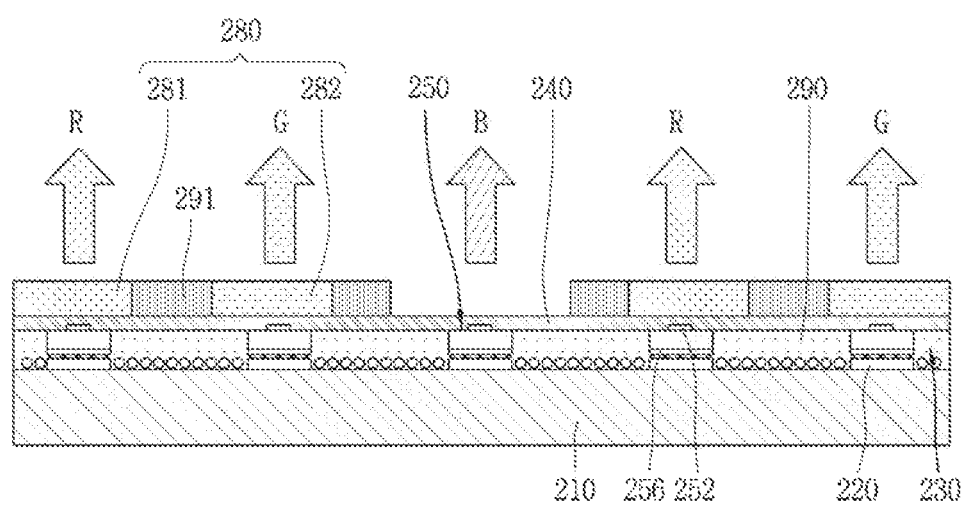
FIG. 8 is a cross-sectional view taken along line D-D in FIG. 7.
Figure 9:
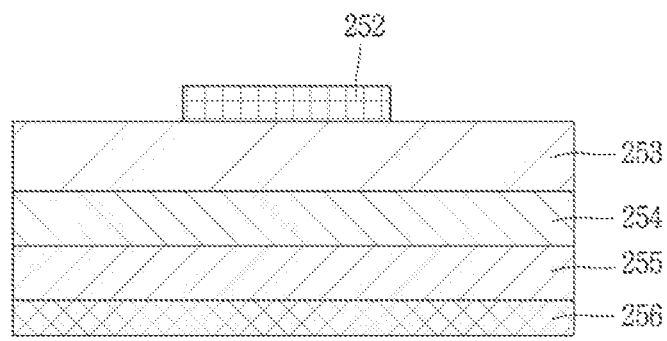
FIG. 9 is a conceptual view illustrating a vertical type semiconductor light emitting element in FIG. 8.

FIG. 7 is a perspective view illustrating a display device using a semiconductor light emitting element according to another embodiment of the present disclosure. FIG. 8 is a cross-sectional view taken along line C-C in FIG. 7, and FIG. 9 is a conceptual view illustrating a vertical type semiconductor light emitting element in FIG. 8.

According to the drawings, the display device may be display device using a passive matrix (PM) type of vertical semiconductor light emitting element.

The display device may include a substrate 210, a first electrode 220, a conductive adhesive layer 230, a second electrode 240 and a plurality of semiconductor light emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting element 250 thereto, the semiconductor light emitting element 250 is electrically connected to the first electrode 220. At this time, the semiconductor light emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting element 250 and the first electrode 220.

In this manner, the semiconductor light emitting element 250 is placed on the conductive adhesive layer 230, thereby configuring a separate sub-pixel in the display device. The semiconductor light emitting element 250 may have excellent luminance characteristics, and thus it may be possible to configure individual sub-pixels even with a small size thereof. The size of the individual semiconductor light emitting element 250 may be less than 80 μm in the length of one side thereof, and formed with a rectangular or square shaped element. In case of a rectangular shaped element, the size thereof may be less than 20×80 μm.

The semiconductor light emitting element 250 may be a vertical structure.

A plurality of second electrodes 240 disposed in a direction of crossing the length direction of the first electrode 220, and electrically connected to the vertical semiconductor light emitting element 250 may be located between vertical semiconductor light emitting elements.

Referring to FIG. 9, the vertical semiconductor light emitting element may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting element 250, thereby providing a great advantage capable of reducing the chip size.

Referring again to FIG. 8, a phosphor layer 280 may be formed on one surface of the semiconductor light emitting element 250. For example, the semiconductor light emitting element 250 is a blue semiconductor light emitting element that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting element at a location implementing a red sub-pixel, and a green phosphor 282 capable of converting blue light into green (G) light may be deposited on the blue semiconductor light emitting element at a location implementing a green sub-pixel. Furthermore, only the blue semiconductor light emitting element may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light emitting elements 250, and electrically connected to the semiconductor light emitting elements 250. For example, the semiconductor light emitting elements 250 may be disposed in a plurality of rows, and the second electrode 240 may be located between the rows of the semiconductor light emitting elements 250.

Since a distance between the semiconductor light emitting elements 250 constituting individual pixels is sufficiently large, the second electrode 240 may be located between the semiconductor light emitting elements 250.

The second electrode 240 may be formed with a bar-shaped electrode elongated in one direction, and disposed in a perpendicular direction to the first electrode.

Furthermore, the second electrode 240 may be electrically connected to the semiconductor light emitting element 250 by a connecting electrode protruded from the second electrode 240. More specifically, the connecting electrode may be an n-type electrode of the semiconductor light emitting element 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting element 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light emitting element 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting element 250, the ITO material has a problem of bad adhesiveness with an n-type semiconductor. Accordingly, the second electrode 240 may be placed between the semiconductor light emitting elements 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting elements 250. In other words, the partition wall 290 may be disposed between the vertical semiconductor light emitting elements 250 to isolate the semiconductor light emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting element 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light emitting elements 250, the partition wall 290 may be located between the semiconductor light emitting element 250 and second electrode 240. Accordingly, individual sub-pixels may be configured even with a small size using the semiconductor light emitting element 250, and a distance between the semiconductor light emitting elements 250 may be relatively sufficiently large to place the second electrode 240 between the semiconductor light emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light emitting element 250 is located on the conductive adhesive layer 230, thereby constituting individual pixels on the display device. The semiconductor light emitting element 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light emitting element.

When the flip chip type is applied to a display device using the foregoing semiconductor light emitting element of the present disclosure, it has a size with a limited area since the n-electrode is formed on the n-type semiconductor layer, and the p-electrode is formed on the p-type semiconductor layer. Furthermore, it has restriction in increasing luminance since the area of an upper surface on which light is emitted from the semiconductor light emitting element is small. Moreover, the semiconductor light emitting element has a drawback in that it is weak against to an impact due to a low thickness thereof. In particular, in a case of digital signage, the property of flexibility may not be required, and thus a different approach may be required for a display using a semiconductor light emitting element.

In the present disclosure, a semiconductor light emitting element having a new structure capable of solving such a problem will be presented. Hereinafter, a display device to which a flip chip type light emitting device according to another embodiment of the present disclosure capable of solving such a problem is applied will be described.

Figure 10:
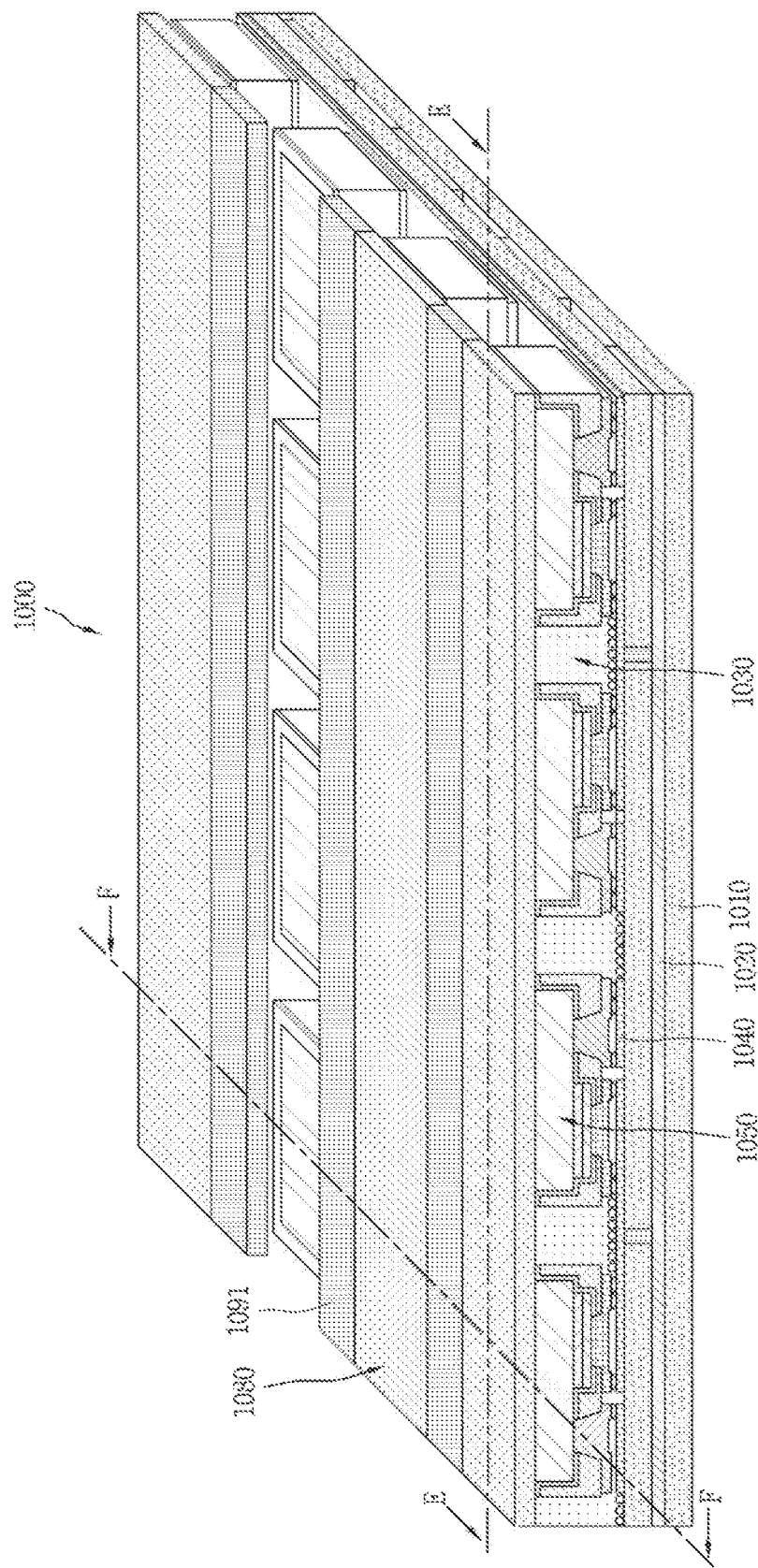
FIG. 10 is an enlarged view of portion "A" in FIG. 1 for explaining another embodiment of the present disclosure to which a semiconductor light emitting element having a new structure is applied.
Figure 11:
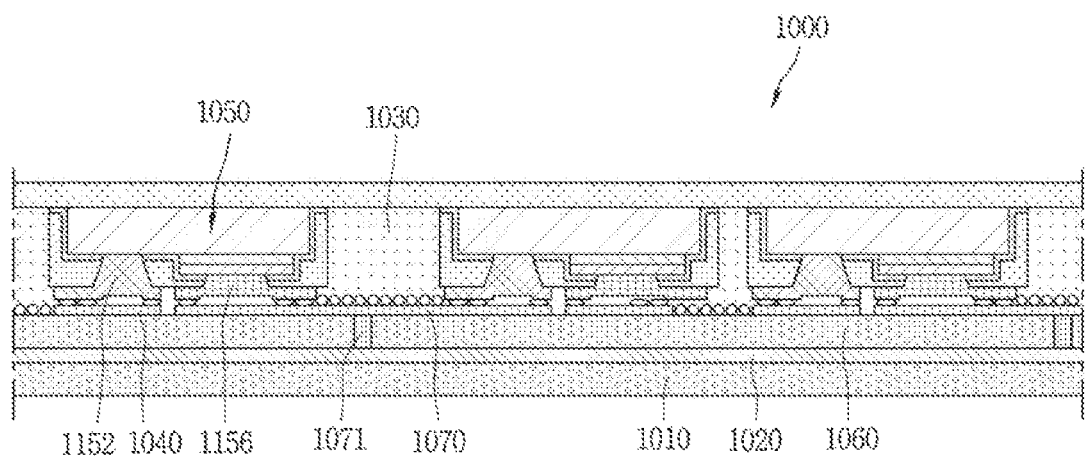
FIG. 11 is a cross-sectional view taken along line E-E in FIG. 10.
Figure 12:
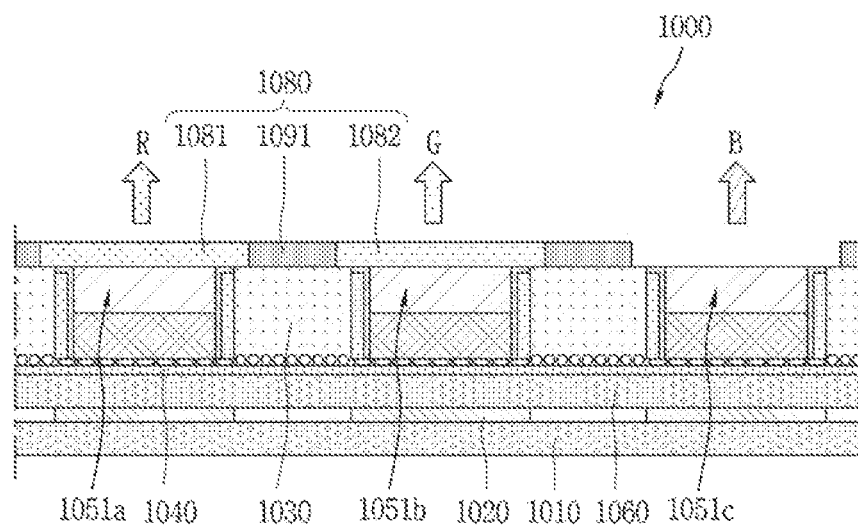
FIG. 12 is a cross-sectional view taken along line F-F in FIG. 10.
Figure 13:
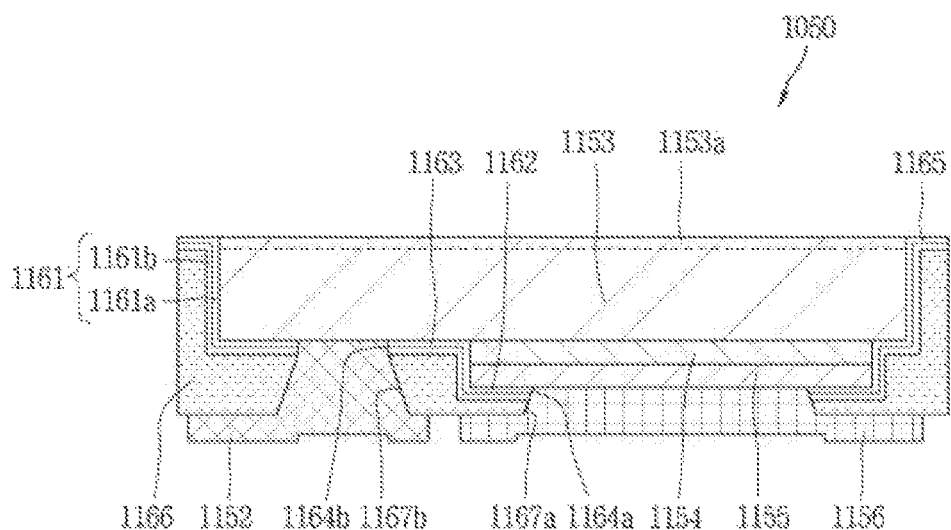
FIG. 13 is a conceptual view showing a flip chip type semiconductor light emitting element in FIG. 11.

FIG. 10 is an enlarged view of portion "A" in FIG. 1 for explaining another embodiment of the present disclosure to which a semiconductor light emitting element having a new structure is applied, FIG. 11 is a cross-sectional view taken along line E-E in FIG. 10, FIG. 12 is a cross-sectional view taken along line F-F in FIG. 10, and FIG. 13 is a conceptual view illustrating a flip chip type semiconductor light emitting element in FIG. 11.

According to the drawings in FIGS. 10, 11 and 12, there is illustrated a display device 1000 using a passive matrix (PM) type semiconductor light emitting element as a display device 1000 using a semiconductor light emitting element. However, an example described below may also be applicable to an active matrix (AM) type semiconductor light emitting element.

The display device 1000 may include a substrate 1010, a first electrode 1020, a conductive adhesive layer 1030, a second electrode 1040, and a plurality of semiconductor light emitting elements 1050. Here, the first electrode 1020 and the second electrode 1040 may respectively include a plurality of electrode lines.

The substrate 1010 as a wiring substrate disposed with the first electrode 1020 may include polyimide (PI) to implement a flexible display device. In this case, according to circumstances, the substrate 1010 may be formed of an insulating but non-flexible material. Furthermore, the substrate 1010 may be either one of transparent and non-transparent materials.

According to the drawing, an insulating layer 1060 may be disposed on the substrate 1010 placed with the first electrode 1020, and an auxiliary electrode 1070 may be placed on the insulating layer 1060. In this case, a configuration in which the insulating layer 1060 is deposited on the substrate 1010 may be single wiring substrate. More specifically, the insulating layer 1060 may be incorporated into the substrate 1010 with an insulating material such as polyimide (PI), PET, PEN or the like to form single wiring substrate.

The first electrode 1020 may be located on the substrate 1010, and formed with a bar-shaped electrode elongated in one direction. The first electrode 1020 may be formed to perform the role of a data electrode.

The auxiliary electrode 1070 as an electrode for electrically connecting the first electrode 1020 to the semiconductor light emitting element 1050 is placed on the insulating layer 1060, and disposed to correspond to the location of the first electrode 1020. For example, the auxiliary electrode 1070 has a dot shape, and may be electrically connected to the first electrode 1020 by means of an electrode hole 1071 passing through the insulating layer 1060. The electrode hole 1071 may be formed by filling a conductive material in a via hole.

Referring to the drawings, the conductive adhesive layer 1030 may be formed on one surface of the insulating layer 1060, but the present disclosure may not be necessarily limited to this. For example, an electrode of the semiconductor light emitting element may also be coupled to the wiring electrode by soldering or the like. In this case, the conductive adhesive layer in the present example may be excluded.

In the present example, the conductive adhesive layer 1030 is formed on the substrate 1010 located with the first electrode 1020. Similar to a display device to which the foregoing flip chip type light emitting device is applied, the conductive adhesive layer 1030 may be an anisotropic conductive film (ACF).

Referring again to the drawing, the second electrode 1040 is located at the insulating layer 1060 to be separated from the auxiliary electrode 1070. Specifically, a plurality of second electrodes 1040 disposed in a direction of crossing the length direction of the first electrode 1020, and electrically connected to the semiconductor light emitting element 1050 may be located on the insulating layer 1060. In other words, the conductive adhesive layer 1030 is disposed on the insulating layer 1060 located with the auxiliary electrode 1070 and second electrode 1040.

When the conductive adhesive layer 1030 is formed in a state that the auxiliary electrode 1070 and second electrode 1040 are located on the insulating layer 1060, and then the semiconductor light emitting element 1050 is connect thereto in a flip chip form with the application of heat and pressure, the semiconductor light emitting element 1050 is electrically connected to the first electrode 1020 and second electrode 1040.

Moreover, the display device 1000 may further include a phosphor layer 1080 formed on one surface of the plurality of semiconductor light emitting elements 1050. For example, the semiconductor light emitting element 1050 is a blue semiconductor light emitting element that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light emitting element 1051a at a location implementing a red sub-pixel, and a green phosphor 1082 capable of converting blue light into green (G) light may be deposited on the blue semiconductor light emitting element 1051b at a location implementing a green sub-pixel. Furthermore, only the blue semiconductor light emitting element 1051c may be solely used at a location implementing a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light emitting element 1050 may be combined with a quantum dot (QD) instead of a phosphor to implement sub-pixels that emit red (R), green (G) and blue (B).

On the other hand, in order to improve the contrast of the phosphor layer 1080, the display device may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection. The black matrix 1091 is located between respective phosphor layers along the first electrode 1020 in a direction in which the phosphor layers 1080 are deposited. In this case, a phosphor layer may not be formed at a position corresponding to the blue semiconductor light emitting element 1051, but the black matrix 1091 may be respectively formed at both sides thereof by interposing a space that does not have the blue light emitting device 1051c therebetween.

As shown in the drawing, the plurality of semiconductor light emitting elements 1050 may form a plurality of columns in a direction parallel to a plurality of electrode lines provided in the first electrode 1020. However, the present disclosure is not necessarily limited thereto. For example, the plurality of semiconductor light emitting elements 1050 may form a plurality of columns along the second electrode 1040.

According to the semiconductor light emitting element 1050 in the present example, it may increase the luminous efficiency and durability of a display device using a double passivation layer.

Referring to FIG. 13, the semiconductor light emitting element 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

The first conductive electrode 1156 is formed on one surface of the first conductive semiconductor layer 1155, and the active layer 1154 is formed between the other surface of the first conductive semiconductor layer 1155 and one surface of the second conductive semiconductor layer 1153, and the second conductive electrode 1152 is formed on one surface of the second conductive semiconductor layer 1153.

In this case, the second conductive electrode 1152 is disposed on one surface of the second conductive semiconductor layer 1153 that is not covered by the first conductive semiconductor layer 1155, and an undoped semiconductor layer 1153*a* is formed on the other surface of the second conductive semiconductor layer 1153.

The first conductive electrode 1156 and the second conductive electrode 1152 may include at least one of Ti, Cr, Pt, Au, Cu, Sn, Ni, Mo, Ag, Al, and In, and formed with a multi-layer including an adhesive layer, a barrier layer, a low-resistance layer, an anti-oxidation layer, and the like.

Referring to FIG. 13 together with FIGS. 10 through 12, one surface of the second conductive semiconductor layer 1153 disposed with the second conductive electrode 1152 may be a lower surface closest to the wiring substrate, and the other surface of the second conductive semiconductor layer 1153 may be an upper surface farthest from the wiring substrate.

Furthermore, the first conductive electrode 1156 and the second conductive electrode 1152 may have a height difference from each other in a vertical direction (or thickness direction) at positions spaced apart along the width direction of the semiconductor light emitting element. In this case, the first conductive electrode 1156 may be electrically connected to the auxiliary electrode 1070, and the second conductive electrode 1152 to the second electrode 1040 by the conductive adhesive layer 1030.

Here, the semiconductor light emitting element includes a first passivation layer 1161 formed to cover outer surfaces of the first conductive semiconductor layer 1155 and the second conductive semiconductor layer 1153. For example, the first passivation layer 1161 may be formed to surround the lateral surfaces and the bottom surfaces of the first conductive semiconductor layer 1155 and the second conductive semiconductor layer 1153.

The first passivation layer 1161 covers the lateral surface of the semiconductor light emitting element to stabilize the characteristics of the semiconductor light emitting element and is formed of an insulating material. For an example, the first passivation layer 1161 may be an insulating thin film made of a silicon compound or oxide. More specifically, the first passivation layer 1161 may be formed of one or more materials of $Al_xO_y$, $Si_xO_y$, $Si_xN_y$, $Sn_xO_y$, $Ti_xO_y$, $CrO_x$, and $ZrO_x$.

As described above, the first conductive semiconductor layer 1155 and the second conductive semiconductor layer 1153 are electrically disconnected by the first passivation layer 1161, and thus the p-type GaN and n-type GaN of the semiconductor light emitting element may be insulated from each other.

In this case, the first passivation layer 1161 may include a plurality of layers 1161*a*, 1161*b* having different refractive indices so as to reflect light emitted to the lateral surfaces of the first conductive semiconductor layer 1155 and the second conductive semiconductor layer 1153. However, the present disclosure is not limited thereto, and the first passivation layer 1161 may be formed as a single layer.

The plurality of layers may be repeatedly deposited with a material having a relatively high refractive index and a material having a relatively low refractive index. Wherein the material having a high refractive index includes at least one of SiN, TiO2, Al2O3, and ZrO2, the material having a low refractive index includes SiO2, and a refractive index difference between the material having a high refractive index and the material having a low refractive index may be 0.3 or more. For an example, the refractive index difference between the material having a high refractive index and the material having a low refractive index may be may be 0.3 to 0.9. In micro-unit semiconductor light emitting elements, since each of the devices is isolated, an increase in light extraction efficiency may be expected when light escaping from a side surface of the device to the outside is collected into the device. In the present disclosure, a dielectric layer having a refractive index difference is repeatedly deposited on the first passivation layer 1161 of the semiconductor light emitting element, thereby adjusting an exit angle of light so as to collect light into the device.

On the other hand, according to the illustration, a second passivation layer 1166 is formed to cover the first passivation layer 1161. The second passivation layer 1166 is formed of a polymer material, thereby improving the insulation characteristics of the semiconductor light emitting element and allowing the p-electrode to extend to an outside of the multilayer quantum well region. Furthermore, the shape and position variation of the p-electrode and n-electrode may be allowed, and the p-electrode and n-electrode may extend to a region with no GaN.

The polymer material may be formed of a material having a high transmittance, and may have a characteristic that there is no discoloration of LED light. For such an example, the polymer material may include at least one of PI, PAI, an acrylic mixture, an epoxy mixture, a phenol formaldehyde mixture, novolac resin, and Si base resin. At this time, the second passivation layer 1166 may be formed by leaving an etching mask used while forming an insulating layer pattern, as an additional insulating layer, without removing the etching mask.

The second passivation layer 1166 is formed to vary in thickness at least in part. In other words, the first passivation layer 1161 is formed with a uniform thickness, but the second passivation layer 1166 is formed with a non-uniform thickness to have a different pattern from the first passivation layer 1161.

The first passivation layer 1161 includes a first portion 1162 covering a lower surface of the first conductive semiconductor layer 1155 and a second portion 1163 covering a lower surface of the second conductive semiconductor layer 1153. Since only part of the lower surface of the second conductive semiconductor layer 1153 overlaps with the first conductive semiconductor layer 1155, and the first passivation layer 1161 covers the first conductive semiconductor layer and the second conductive semiconductor layer 1153 with a uniform thickness, the first portion 1162 and the second portion 1163 may be formed.

According to the illustration, the first portion 1162 and the second portion 1163 may have a height difference with respect to the second conductive semiconductor layer 1153. In a structure without having the second passivation layer 1166, the first conductive electrode 1156 and the second conductive electrode 1152 must be disposed within the projection planes of the first portion 1162 and the second portion 1163, respectively, due to the height difference. In the present example, the second passivation layer 1166 overcomes such a drawback. In general, as an area of the multilayer quantum well layer increases, the current density is lowered and the light-emitting characteristics of the semiconductor light emitting element is improved, but a region of the n-electrode is decreased, which leads to deterioration in electrode connection.

For a structure overcoming the drawback, an outer surface of a portion that covers the first portion 1162 and the second portion 1163 in the second passivation layer 1166 may be a lower surface of the second passivation layer 1166, and the lower surface of the second passivation layer 1166 may be formed as a plane with no height difference due to a thickness variation of the second passivation layer 1166. For example, the second passivation layer may be formed to have different thicknesses that cover the first portion 1162 and the second portion 1163. In other words, the second passivation layer 1166 is formed to cover the second portion 1163 with a larger thickness than the first portion 1162. The second passivation layer 1166 may be formed to have a different cross-sectional shape from the first passivation layer 1161 due to the thickness variation. A plurality of layers of the first passivation layer 1161 may be formed with the same cross section, and the second passivation layer 1166 may have a different cross section. Here, the cross section to be compared may be a cross section perpendicular to a front surface of the display as shown in the drawing.

On the other hand, through-holes are formed in the first passivation layer 1161 and the second passivation layer 1166, and the first conductive electrode 1156 and the second conductive electrode 1152 are respectively extended to a plane with no height difference on the second passivation layer 1166 through the through-holes.

In this case, a lower surface of the second passivation layer 1166 has an area different from that of the first passivation layer 1161. Since the lower surface of the second passivation layer 1166 forms a plane with no height difference, an area of the lower surface of the second passivation layer 1166 may be larger than that of the lower surface of the first passivation layer 1161. Therefore, a degree of design freedom for the areas and shapes of the first conductive electrode 1156 and the second conductive electrode 1152 extended to the lower surface of the second passivation layer 1166 is increased. That is, as shown in the present example, the areas of the first conductive electrode 1156 and the second conductive electrode 1152 may be increased as compared with a case where the first passivation 1161 is not provided.

For example, a first through-hole 1164a and a second through-hole 1164b corresponding to the first conductive electrode 1156 and the second conductive electrode 1152, respectively, are formed in the first passivation layer 1161, and a third through-hole 1167a and a fourth through-hole 1167b corresponding to the first conductive electrode 1156 and the second conductive electrode 1152, respectively, are also formed in the second passivation layer 1166. The first through-hole 1164a of the first passivation layer 1161 and the third through-hole 1167a of the second passivation layer 1166 may communicate with each other at positions corresponding to each other, and the second through-hole 1164b of the first passivation layer 1166 and the fourth through-hole 1167b of the second passivation layer 1166 may communicate with each other at positions corresponding to each other.

As described above, the first conductive electrode 1156 and the second conductive electrode 1152 are extended to a plane of the second passivation layer 1166 from the first conductive semiconductor layer 1155 and the second conductive semiconductor layer 1153 through through-holes, respectively, and may be formed on the plane with a larger area as compared with a case where the first passivation 1161 is not provided.

According to the illustration, the second passivation layer 1166 includes a portion that does not overlap with the second conductive semiconductor layer 1153 along a thickness direction of the semiconductor light emitting element, and at least one of the first conductive electrode 1156 and the second conductive electrode 1152 is formed to cover the non-overlapping portion. Since the second passivation layer 1166 is formed on an outer surface of the first passivation layer, a lower surface of the second passivation layer 1166 may be protruded laterally from a side surface of the second conductive semiconductor layer 1153. Through this, an area of the lower surface of the second passivation layer 1166 may be further enlarged, and the first conductive electrode 1156 or the second conductive electrode 1152 are extended to the enlarged area.

More specifically, the first passivation layer 1161 may include a protruding portion 1165 protruded from a side surface of the second conductive semiconductor layer 1153, and an end portion of the second passivation layer 1166 may be formed to cover the protruding portion 1165 in a thickness direction of the semiconductor light emitting element.

The first passivation layer 1161 may have a side body covering the side surfaces of the first conductive semiconductor layer 1155 and the second conductive semiconductor layer 1153, and the protruding portion 1165 may be protruded from one end of the side body in a direction intersecting with the side body. The protruding portion 1165 may be formed to overlap with the phosphor layer 1080 disposed to cover the plurality of semiconductor light emitting elements. When light emitted from an upper surface of the second conductive semiconductor layer 1153 is reflected inside the phosphor layer 1080, and directed to the semiconductor light emitting element, the light may be reflected upward by the protruding portion 1165. According to such a structure, the luminance of the display device may be further increased.

An end portion of the second passivation layer 1166 covers the protruding portion 1165 in a thickness direction of the semiconductor light emitting element. At this time, a thickness of the corresponding portion of the second passivation layer 1166 covering the side surfaces of the first conductive semiconductor layer 1155 and the second conductive semiconductor layer 1153 may be equal to a protrusion length of the protruding portion. Through such a structure, on a lower surface of the second passivation layer 1166, an edge area thereof may be enlarged by at least a length of the protruding portion.

As illustrated in the drawing, as the first conductive electrode 1156 or the second conductive electrode 1152 is extended to the enlarged surface of the second passivation layer 1166, an area of the first conductive electrode 1156 or the second conductive electrode 1152 is further increased.

According to the structure described above, it may be possible to prevent damage due to a physical impact on an inner passivation layer having a uniform thickness through an outer passivation layer formed with a non-uniform thickness. In addition, the area of the n-electrode and p-electrode may be further increased, and thus the electrical connection path may be made more uniform and the rear reflection surface by the electrode may be widened, thereby increasing the luminous efficiency.

Meanwhile, the semiconductor light emitting element applied to the display device described above may be modified into various forms. Hereinafter, these modified examples will be described.

Figure 14A:
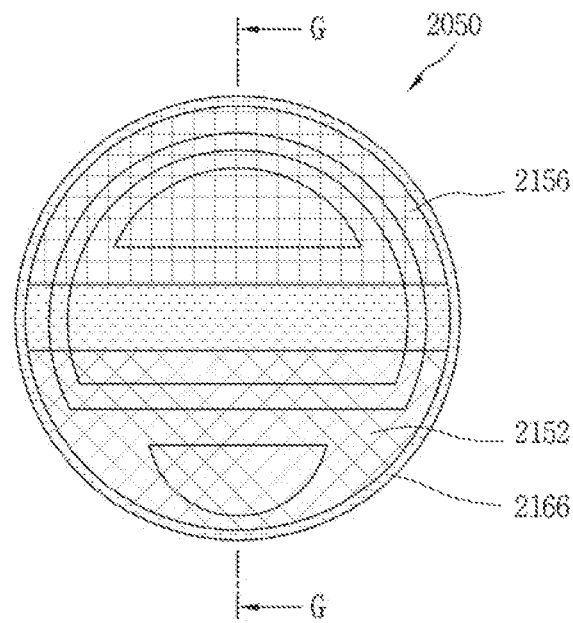
FIG. 14A is a plan view of a semiconductor light emitting element for explaining another embodiment of the present disclosure.
Figure 14B:
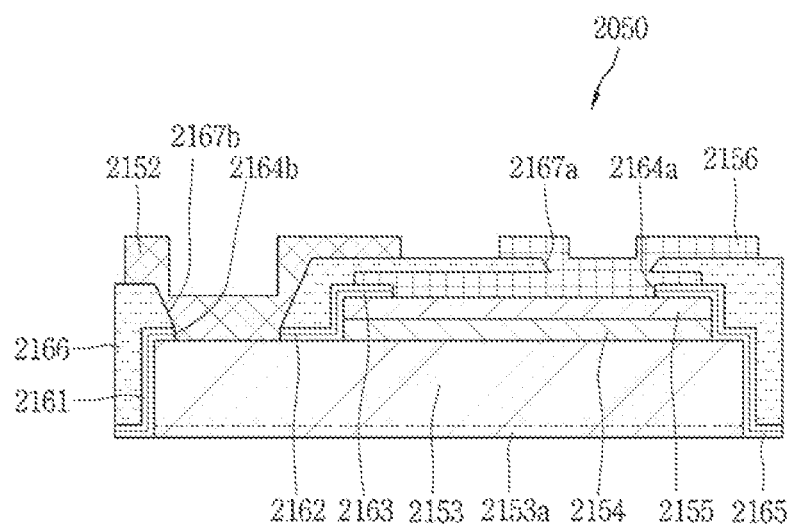
FIG. 14B is a cross-sectional view taken along line G-G in FIG. 14A.
Figure 15A:
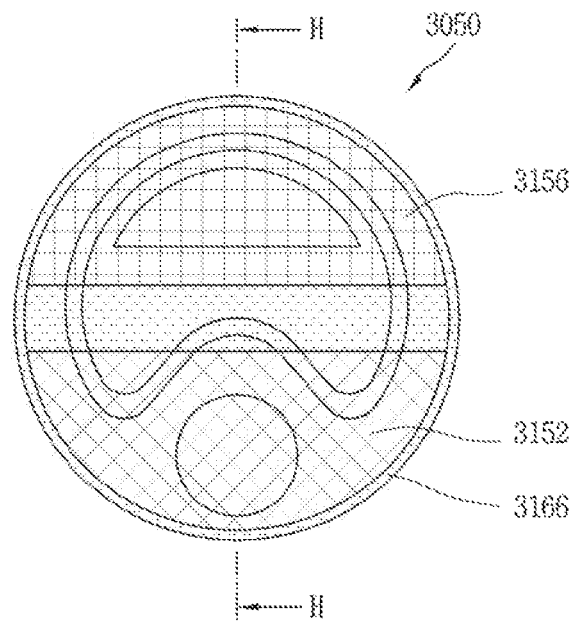
FIG. 15A is a plan view of a semiconductor light emitting element for explaining still another embodiment of the present disclosure.
Figure 15B:
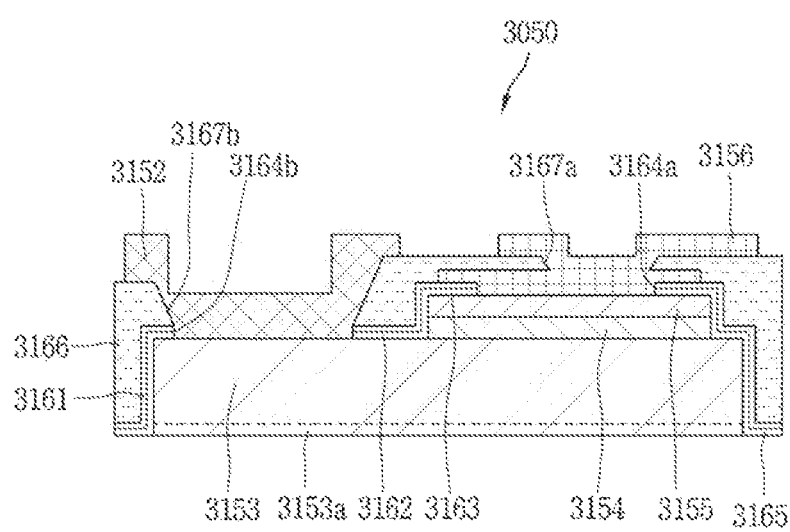
FIG. 15B is a cross-sectional view taken along line H-H in FIG. 15A.

FIG. 14A is a plan view of a semiconductor light emitting element for explaining another embodiment of the present disclosure, and FIG. 14B is a cross-sectional view taken along line G-G in FIG. 14A. Furthermore, FIG. 15A is a plan view of a semiconductor light emitting element for explaining still another embodiment of the present disclosure, and FIG. 15B is a cross-sectional view taken along line H-H in FIG. 15A.

The shape of the semiconductor light emitting element may be a circular, triangular, square or polygonal shape having symmetry, and for example, the semiconductor light emitting element may be a circle having a ratio of an edge farthest from the center of gravity to an edge closest to the center of gravity of 2:1 or less, or a polygonal structure having four or more angles. In this embodiment, a circular semiconductor light emitting element is presented.

According to the illustration, the circular semiconductor light emitting element 2050 is a horizontal semiconductor light emitting element similarly to the semiconductor light emitting element described above with reference to FIG. 13, and includes a first conductive electrode 2156, a first conductive semiconductor layer 2155 formed with the first conductive electrode 2156, an active layer 2154 formed on the first conductive semiconductor layer 2155, a second conductive semiconductor layer 2153 formed on the active layer 2154, and a second conductive electrode 2152 formed on the second conductive semiconductor layer 2153.

More specifically, the first conductive electrode 2156 and the first conductive semiconductor layer 2155 may be a p-type electrode and a p-type semiconductor layer, respectively, and the second conductive electrode 2152 and the second conductive semiconductor layer 2153 may be an n-type electrode and an n-type semiconductor layer, respectively. However, the present disclosure is not limited thereto, and the first conductive type may be n-type and the second conductive type may be p-type.

The first conductive electrode 2156 is formed on one surface of the first conductive semiconductor layer 2155, and the second conductive electrode 2152 is disposed on one surface of the second conductive semiconductor layer 2153 that is not covered by the first conductive semiconductor layer 2155, and an undoped semiconductor layer 2153a is formed on the other surface of the second conductive semiconductor layer 2153.

In this case, the second conductive semiconductor layer 2153 has a cylindrical shape, and the active layer 2154 and the first conductive semiconductor layer 2155 may be circular columns each having a circle truncated on one side as a cross section thereof. Accordingly, a portion of the lower surface of the second conductive semiconductor layer 2153 that is not covered by the first conductive semiconductor layer 2155 may be a truncated circular shape. In this case, as an example illustrated in FIGS. 14A and 14B, a first through-hole 2164a and a third through-hole 2167b corresponding to the first conductive electrode 2156 and a second through-hole 2164b and a fourth through-hole 2167a corresponding to the second conductive electrode 2152 may respectively be a circular shape truncated on one side.

For another example, as illustrated in FIGS. 15A and 15B, the active layer 3154 and the first conductive semiconductor layer 3155 may respectively be formed in a shape in which one side of a circular shape is recessed concavely. In this case, a first through-hole 3164a and a third through-hole 3167a corresponding to the first conductive electrode 3156 may be formed in a circle truncated on one side, but a second through-hole 3164b and a fourth through-hole 3167b corresponding to the second conductive electrode 3152 may be a circular shape.

The semiconductor light emitting element 3050 in an example illustrated in FIGS. 15A and 15B includes a first conductive electrode 3156, a first conductive semiconductor layer 3155 formed with the first conductive electrode 3156, an active layer 3154 formed on the first conductive semiconductor layer 3155, a second semiconductor layer 3153 formed on the active layer 3154, a second conductive electrode 3152 formed on the second conductive semiconductor layer 3153, a first passivation layer 3161, and a second passivation layer 3166, and the detailed description thereof will be substituted by the foregoing and the following description described with reference to FIGS. 10 through 14B. And an undoped semiconductor layer 3153a is formed on the other surface of the second conductive semiconductor layer 3153. The first passivation layer 3161 includes a first portion 3162 covering a lower surface of the second conductive semiconductor layer 3153 and a second portion 3163 covering a lower surface of the first conductive semiconductor layer 3155. And the first passivation layer 3161 may include a protruding portion 3165 protruded from a side surface of the second conductive semiconductor layer 3153.

Referring again to FIGS. 14A and 14B, the first conductive electrode 2156 and the second conductive electrode 2152 may respectively be a truncated circular conductive electrode. More specifically, the first conductive electrode 2156 and the second conductive electrode 2152 may respectively have a planar shape with a circular shape truncated on one side.

In this case, other structures other than the shapes of the first conductive electrode 2156 and the second conductive electrode 2152, such as a material or a layer, are the same as those of the semiconductor light emitting element described above with reference to FIG. 13, and thus the description thereof will be substituted by the earlier description.

Furthermore, the first conductive electrode 2156 and the second conductive electrode 2152 may have a height difference from each other in a vertical direction (or thickness direction) at positions spaced apart along the width direction of the semiconductor light emitting element.

Here, the semiconductor light emitting element includes a first passivation layer 2161 formed to cover the outer surfaces of the first conductive semiconductor layer 2155 and the second conductive semiconductor layer 2153. For example, the first passivation layer 2161 may be formed to surround the lateral surfaces and the bottom surfaces of the first conductive semiconductor layer 2155 and the second conductive semiconductor layer 2153. And the first passivation layer 2161 may include a protruding portion 2165 protruded from a side surface of the second conductive semiconductor layer 2153. In this case, the second passivation layer 2166 is formed to cover the first passivation layer 2161. The material, layer and the like of the first passivation layer 2161 and the second passivation layer 2166 are the same as those of the semiconductor light emitting element described above with reference to FIG. 13, and thus the description thereof is substituted by the earlier description.

The second passivation layer 2166 is formed to vary in thickness at least in part. In other words, the first passivation layer 2161 is formed with a uniform thickness, but the second passivation layer 2166 is formed with a non-uniform thickness to have a different pattern from the first passivation layer 2161. Using a thickness variation of the second passivation layer 2166, in particular, a lower surface of the second passivation layer 2166 may be a circular plane. The first portion 2162 and the second portion 2163 of the first passivation layer 2161 may have a height difference with respect to the second conductive semiconductor layer 2153. In the present example, the height difference is eliminated through the second passivation layer 2166 to form a circular plane.

A ratio of projected areas of the first conductive electrode 2156 and the second conductive electrode 2152 may be formed closer to 1:1 than that of projected areas of the first conductive semiconductor layer 2155 and the second conductive semiconductor layer 2153. For this purpose, an area of the second conductive electrode 2152 may be further enlarged in the second passivation layer 2166, and at least part of the second conductive electrode 2152 may overlap with the first conductive semiconductor layer 2155 along a thickness direction of the semiconductor light emitting element. In other words, there exists a region in which a metal layer of the n-electrode or the p-electrode overlaps.

For such an example, the first conductive electrode 2156 and the second conductive electrode 2152 may be formed symmetrically with respect to the center of a circular shape of the second passivation layer 2166. For a more specific example, the first conductive electrode 2156 and the second conductive electrode 2152 may respectively have a shape truncated on one side and the other side in a circle.

According to the structure described above, an area of the multilayer quantum well layer may be made as wide as possible, and a polymer insulating layer may be formed and then a size of the n- and p-electrodes may be controlled at a ratio of 1:1.

The configurations and methods according to the above-described embodiments will not be applicable in a limited way to the foregoing display device using a semiconductor light emitting element, and all or part of each embodiment may be selectively combined and configured to make various modifications thereto.

What is claimed is:

1. A display device comprising:
    a plurality of semiconductor light emitting elements mounted on a substrate,
    wherein at least one of the semiconductor light emitting elements comprises:
        a first electrode and a second electrode spaced apart from each other;
        a first conductivity type semiconductor layer disposed with the first electrode;
        a second conductivity type semiconductor layer configured to overlap with the first conductivity type semiconductor layer, and disposed with the second electrode;
        a first passivation layer covering outer surfaces of the first conductivity type semiconductor layer and the second conductivity type semiconductor layer; and
        a second passivation layer coveting the first passivation layer,
    wherein the first conductivity type semiconductor layer is disposed higher than the second conductivity type semiconductor layer, and
    wherein at least one portion of the second electrode is overlapped with at least one portion of the first electrode along a thickness direction of the at least one semiconductor light emitting element.

2. The display device of claim 1, wherein the first passivation layer comprises a first through-hole on the first conductivity type semiconductor layer, and wherein the second passivation layer comprises a third through-hole on the first passivation layer.

3. The display device of claim 2, wherein the first electrode comprises a first electrode portion in the first through-hole and a second electrode portion in the third through-hole,
    wherein the first electrode portion has a first width in the first through-hole and the second electrode portion has a second width less than the first width in the first through-hole, and
    wherein the first electrode portion has a protruding first electrode portion extended above the first passivation layer.

4. The display device of claim 3, wherein the second electrode has a protruding second electrode portion extended above the second passivation layer,
    wherein the protruding first electrode portion of the first electrode portion is disposed below the protruding second electrode portion of the second electrode, and
    wherein the protruding second electrode portion of the second electrode is overlapped with the protruding first electrode portion of the first electrode along the thickness direction of the at least one semiconductor light emitting element.

5. The display device of claim 4, wherein the first passivation layer comprises a first portion covering a lower surface of the first conductivity type semiconductor layer and a second portion covering a lower surface of the second conductivity type semiconductor layer, and
    wherein the first portion and the second portion have a height difference with respect to the second conductivity type semiconductor layer.

6. The display device of claim 5, wherein an outer surface of a portion covering the first portion and the second portion on the second passivation layer is a lower surface of the second passivation layer, and
    the lower surface of the second passivation layer is formed as a plane with no height difference due to a thickness variation of the second passivation layer.

7. The display device of claim 6, wherein at least a part of the second electrode overlaps with the first conductivity type semiconductor layer along the thickness direction of the at least one semiconductor light emitting element.

8. The display device of claim 6, wherein a ratio of projected areas of the first electrode and the second electrode is formed closer to 1:1 than that of projected areas of the first conductivity type semiconductor layer and the second conductivity type semiconductor layer.

9. The display device of claim 1, wherein the first passivation layer comprises a protruding portion protruded from a side surface of the second conductivity type semiconductor layer.

10. The display device of claim 9, wherein an end portion of the second passivation layer is formed to cover the protruding portion in the thickness direction of the at least one semiconductor light emitting element.

11. A semiconductor light emitting element, comprising:
    a first electrode and a second electrode spaced apart from each other;
    a first conductivity type semiconductor layer disposed with the first electrode;
    a second conductivity type semiconductor layer configured to overlap with the first conductivity type semiconductor layer and disposed with the second electrode;

a first passivation layer formed to cover outer surfaces of the first conductivity type semiconductor layer and the second conductivity type semiconductor layer; and a second passivation layer formed to cover the first passivation layer, and formed to vary in thickness in at least a part thereof, wherein the first passivation layer comprises a first through-hole on the first conductivity type semiconductor layer, and the second passivation layer comprises a third through-hole on the first passivation layer, wherein the first conductivity type semiconductor layer is disposed above the second conductivity type semiconductor layer, and wherein at least one portion of the second electrode is overlapped with at least one portion of the first electrode along a thickness direction of the semiconductor light emitting element.

12. The semiconductor light emitting element of claim 11, wherein the first electrode comprises a first electrode portion in the first through-hole and a second electrode portion in the third through-hole, and wherein the first electrode portion has a first width in the first through-hole and the second electrode portion has a second width less than the first width in the first through-hole.

13. The semiconductor light emitting element of claim 12, wherein the first electrode portion has a protruding first electrode portion extended above the first passivation layer, wherein the second electrode has a protruding second electrode portion extended above the second passivation layer, and wherein the protruding first electrode portion of the first electrode portion is disposed below the protruding second electrode portion.

14. The semiconductor light emitting element of claim 13, wherein the protruding second electrode portion of the second electrode is overlapped with the protruding first electrode portion of the first electrode along the thickness direction of the semiconductor light emitting element.

15. The semiconductor light emitting element of claim 14, wherein the first passivation layer comprises a first portion covering a lower surface of the first conductivity type semiconductor layer and a second portion covering a lower surface of the second conductivity, type semiconductor layer, and wherein the first portion and the second portion have a height difference with respect to the second conductivity type semiconductor layer.

16. The semiconductor light emitting element of claim 15, wherein an outer surface of a portion covering the first portion and the second portion on the second passivation layer is a lower surface of the second passivation layer, and wherein the lower surface of the second passivation layer is formed as a plane with no height difference due to a thickness variation of the second passivation layer.

17. The semiconductor light emitting element of claim 16, wherein sizes of the first and third through-holes increase towards a plane with no height difference of the second passivation layer, and wherein the second passivation layer comprises a second through-hole on the second conductive semiconductor layer.

18. The semiconductor light emitting element of claim 17, wherein sizes of the first and third through-holes increase towards a plane with no height difference of the second passivation layer, and wherein the second passivation layer comprises a second through-hole on the second conductive semiconductor layer.

19. The semiconductor light emitting element of claim 18, wherein the first electrode comprises a third electrode portion connected to the second electrode portion on the second passivation layer, and wherein the third electrode portion has a third width less than the first width in the first through-hole.

20. The semiconductor light emitting element of claim 11, wherein the first electrode and the second electrode respectively have a truncated circular shape, and wherein the first electrode and the second electrode respectively have a recess portion thereon.

* * * * *